United States Patent [19]
Higaki

[11] Patent Number: 5,471,160
[45] Date of Patent: Nov. 28, 1995

[54] SENSE AMPLIFIER INCLUDING COMPARATOR

[75] Inventor: Naoshi Higaki, Kawasaki, Japan

[73] Assignee: Fujitsu Limited, Kawasaki, Japan

[21] Appl. No.: 280,324

[22] Filed: Jul. 25, 1994

[30] Foreign Application Priority Data

Sep. 10, 1993 [JP] Japan .................................... 5-226224

[51] Int. Cl.⁶ .................................................. G01R 19/00
[52] U.S. Cl. ................................ 327/51; 327/52; 327/53; 326/52; 326/55
[58] Field of Search ................................ 326/52, 54, 55, 326/112, 119; 327/51, 52, 53, 54, 55, 56, 57, 561, 562, 563; 365/208

*Primary Examiner*—Timothy P. Callahan
*Assistant Examiner*—Jeffrey Zweizig
*Attorney, Agent, or Firm*—Nikaido, Marmelstein, Murray & Oram

[57] ABSTRACT

A logic circuit includes a differential amplifier circuit to which a first input signal and a second input signal both of which are complementary are to be supplied, having a circuit for outputting a first output signal and a second output signal both of which are complementary, the first and second output signals depending on a difference between the first and second input signals, an output terminal, and a switching circuit for, based on a first switching signal and a second switching signal which are complementary, performing a switching operation so that either the first output signal or the second output signal is selected as a signal supplied to the output terminal, wherein the signal supplied to the output terminal is a result of an logical operation of the first input signal and the first switching signal. A current sense amplifier may be substituted for the differential amplifier.

15 Claims, 14 Drawing Sheets

| A | XA | B | XB | C |
|---|---|---|---|---|
| $V_{CC}-\Delta V$ | $V_{CC}$ | H | L | H |
| $V_{CC}$ | $V_{CC}-\Delta V$ | H | L | L |
| $V_{CC}-\Delta V$ | $V_{CC}$ | L | H | L |
| $V_{CC}$ | $V_{CC}-\Delta V$ | L | H | H |

| A | XA | B | XB | C |
|---|---|---|---|---|
| $V_{CC} - \Delta V$ | $V_{CC}$ | H | L | L |
| $V_{CC}$ | $V_{CC} - \Delta V$ | H | L | H |
| $V_{CC} - \Delta V$ | $V_{CC}$ | L | H | H |
| $V_{CC}$ | $V_{CC} - \Delta V$ | L | H | L |

| A | XA | B | XB | C |
|---|---|---|---|---|
| $V_{CC} - \Delta V$ | $V_{CC}$ | H | L | L |
| $V_{CC}$ | $V_{CC} - \Delta V$ | H | L | H |
| $V_{CC} - \Delta V$ | $V_{CC}$ | L | H | H |
| $V_{CC}$ | $V_{CC} - \Delta V$ | L | H | L |

| A | XA | B | XB | C |
|---|---|---|---|---|
| $V_{CC} - \Delta V$ | $V_{CC}$ | H | L | H |
| $V_{CC}$ | $V_{CC} - \Delta V$ | H | L | L |
| $V_{CC} - \Delta V$ | $V_{CC}$ | L | H | L |
| $V_{CC}$ | $V_{CC} - \Delta V$ | L | H | H |

| A | XA | B | XB | C |
|---|---|---|---|---|
| $V_{CC} - \Delta V$ | $V_{CC}$ | H | L | H |
| $V_{CC}$ | $V_{CC} - \Delta V$ | H | L | L |
| $V_{CC} - \Delta V$ | $V_{CC}$ | L | H | L |
| $V_{CC}$ | $V_{CC} - \Delta V$ | L | H | H |

| A | XA | B | XB | C |
|---|---|---|---|---|
| $V_{CC}-\Delta V$ | $V_{CC}$ | H | L | L |
| $V_{CC}$ | $V_{CC}-\Delta V$ | H | L | H |
| $V_{CC}-\Delta V$ | $V_{CC}$ | L | H | H |
| $V_{CC}$ | $V_{CC}-\Delta V$ | L | H | L |

| A | XA | B | XB | C | XC |
|---|---|---|---|---|---|
| $V_{CC} - \Delta V$ | $V_{CC}$ | H | L | H | L |
| $V_{CC}$ | $V_{CC} - \Delta V$ | H | L | L | H |
| $V_{CC} - \Delta V$ | $V_{CC}$ | L | H | L | H |
| $V_{CC}$ | $V_{CC} - \Delta V$ | L | H | H | L |

| A | XA | B | XB | C |
|---|---|---|---|---|
| $V_{CC} - \Delta V$ | $V_{CC}$ | H | L | H |
| $V_{CC}$ | $V_{CC} - \Delta V$ | H | L | L |
| $V_{CC} - \Delta V$ | $V_{CC}$ | L | H | L |
| $V_{CC}$ | $V_{CC} - \Delta V$ | L | H | H |

| A | XA | B | XB | C |
|---|---|---|---|---|
| $V_{CC} - \Delta V$ | $V_{CC}$ | H | L | L |
| $V_{CC}$ | $V_{CC} - \Delta V$ | H | L | H |
| $V_{CC} - \Delta V$ | $V_{CC}$ | L | H | H |
| $V_{CC}$ | $V_{CC} - \Delta V$ | L | H | L |

FIG. 24

| A | XA | B | XB | C |
|---|---|---|---|---|
| $V_{CC} - \Delta V$ | $V_{CC}$ | H | L | H |
| $V_{CC}$ | $V_{CC} - \Delta V$ | H | L | L |
| $V_{CC} - \Delta V$ | $V_{CC}$ | L | H | L |
| $V_{CC}$ | $V_{CC} - \Delta V$ | L | H | H |

SENSE AMPLIFIER INCLUDING COMPARATOR

BACKGROUND OF THE INVENTION (1) Field of the Invention

The present invention generally relates to a logic circuit, and more particularly to a logic circuit using, for example, a C-MOS static circuit.

(2) Description of the Related Art

In recent years, due to a request for a high speed operation in a semiconductor integrated circuit, it is required that each of circuits arranged in the semiconductor integrated circuit can be operated at a high speed.

FIG. 1 shows a structure of an MPU system. Referring to FIG. 1, an MPU 31 is coupled to a main memory 32. The MPU 31 has a data processing portion 33, a high speed address conversion buffer (a TLB portion) 34 and a TAG portion 35 for adding identification information to data. The MPU 31 carries out a data processing for data read out from the main memory 32. The MPU 31 has a function by which if data which has been read out from the main memory 32 is stored in the MPU 31, the data is not read out therefrom again. This function will be described below with reference to FIG. 2.

Referring to FIG. 2, the TAG portion 35 has a memory 36 (formed, for example, of an S-RAM) and a comparing portion 37. Addresses of data stored in the inside of the MPU 31 are stored in the memory 36. The comparing portion 37 compares an address B corresponding to data requested by the TLB portion 34 to an address A stored in the memory 36. If the addresses A and B are identical to each other, the comparing portion 37 outputs a hit signal C.

The comparing portion 37 is formed of a logic circuit by which each bit of the address A from the memory 36 and a corresponding each bit of the address B from the TLB portion 34 are compared with each other. If all bits of the address A are identical to corresponding all bits of the address B, the hit signal C having a high level or a low level is supplied from the comparing portion 37 to the data processing portion 33. As a result, the data processing portion 33 is informed that it is not necessary to access the main memory 32.

FIG. 3A shows a structure of an example of a conventional logic circuit. This logic circuit is a NAND gate as symbolized in FIG. 3B.

Referring to FIG. 3A, the NAND gate is formed of N-channel MOS FET $Q_{51}$–$Q_{54}$. Input terminals $T_{IN41}$ and $T_{IN42}$ are provided with a signal, and Input terminals $T_{IN43}$ and $T_{IN44}$ are provided with a signal B. A NAND logic operation of the signals A and B is carried out, so that an logical output signal C is output from an output terminal $T_{OUT11}$.

The above signals A and B to be input the NAND gate must have a CMOS logic level. Thus, the memory 36 shown in FIG. 2 is provided with a sense amplifier 38 so that the signals amplified by the sense amplifier 38 are supplied to the comparing portion 37.

In the conventional logic circuit, signals must have a predetermined amplitude (e.g. the CMOS logic level) in the logical operation, and the logical operation of infinitesimal signals, such as signals output from a memory, can not be carried out. Thus, the infinitesimal signals are amplified by the sense amplifier so as to have the predetermined level at which the logical operation can be carried out. In this case, signals are supplied to the logic circuit through an amplifier, so that supply of the signals to the logic circuit is delayed by a time for which the signals reach the predetermined level. As a result, the logical operation of infinitesimal signals can not be carried out at a high rate.

SUMMARY OF THE INVENTION

Accordingly, a general object of the present invention is to a novel and useful logic circuit in which the disadvantages of the aforementioned prior art are eliminated.

A more specific object of the present invention is to provide a logic circuit in which the logic operation of infinitesimal signals can be carried out at a high rate.

The above objects of the present invention are achieved by a logic circuit comprising: a differential amplifier circuit to which a first input signal and a second input signal both of which are complementary are to be supplied, having a circuit for outputting a first output signal and a second output signal both of which are complementary, the first and second output signals depending on a difference between the first and second input signals; an output terminal; and switching means for, based on a first switching signal and a second switching signal which are complementary, performing a switching operation so that either the first output signal or the second output signal is selected as a signal supplied to said output terminal, wherein the signal supplied to the output terminal is a result of an logical operation of the first input signal and the first switching signal.

The above objects of the present invention are also achieved by a logic circuit comprising: a current sense amplifier to which a first input signal and a second input signal both of which are complementary are to be supplied, having a circuit for outputting a first output signal and a second output signal both of which are complementary, said current sense amplifier sensing infinitesimal currents corresponding to said first and second input signals and converting the infinitesimal currents into a voltage depending on to a difference between the first and second input signals, an output terminal, and switching means for, based on a first switching signal and a second switching signal which are complementary, performing a switching operation so that either the first output signal or the second output signal is selected as a signal supplied to said output terminal, wherein the signal supplied to the output terminal is a result of a logical operation of the first input signal and the first switching signal.

According to the present invention, the first and second input signals are amplified by the differential amplifier or the current sense amplifier so that the first and the second output signals are obtained. As a result, the amplifying operation of the first and second input signals and the logic operation of the first input signal and the first switching signal are simultaneously performed. Even if the first and second input signal is infinitesimal signals, the logic operation can be carried out without an external amplifier circuit. Thus, the logic operation can be carried out at a high rate.

Additional objects, features and advantages of the present invention will become apparent from the following detailed description when read in conjunction with the accompanying drawings.

DESCRIPTION OF THE DRAWINGS

FIG. 24 is a table showing levels of signals to which the logic operation is applied in the logic circuit shown in FIG. 23.

DESCRIPTION OF THE PREFERRED EMBODIMENTS

A description will be given, with reference to FIGS. 4, 5 and 6, of a first embodiment of the present invention.

Figure 4:
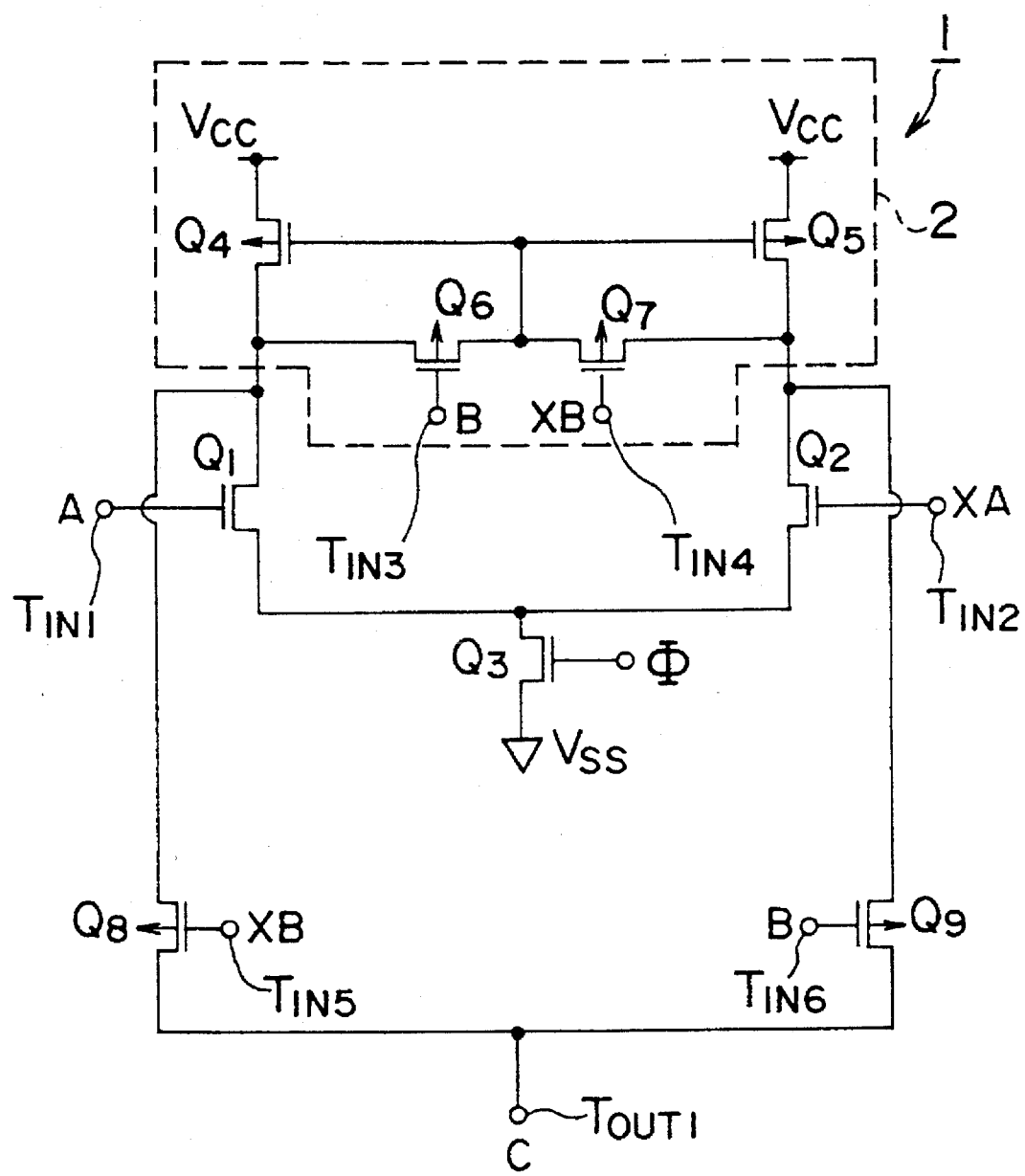
FIG. 4 is a circuit diagram illustrating a logic circuit according to a first embodiment of the present invention.

FIG. 4 shows a structure of a logic circuit according to the first embodiment of the present invention. Referring to FIG. 4, the logic circuit has a differential amplifier circuit 1. The differential amplifier circuit 1 is formed of a current mirror circuit 2, N-channel MOS transistors Q1 and Q2 used for input of signals having an infinitesimal level and an N-channel transistor Q3 used for a constant current supply.

The current mirror circuit 2 is formed of P-channel MOS transistors Q4 and Q5 for current supply and switching P-channel MOS transistors Q6 and Q7 for controlling the P-channel MOS transistors Q4 and Q5. A constant voltage Vcc is applied to the source of each of the P-channel MOS transistors Q4 and Q5. The switching P-channel MOS transistor Q6 is provided between the gate and the drain of the P-channel MOS transistor Q4 so as to be connected to them. The drain of the P-channel MOS transistor Q4 is connected to the drain of the input N-channel MOS transistor Q1. The switching P-channel MOS transistor Q7 is provided between the gate and the drain of the P-channel MOS transistor Q5 so as to be connected to them. The drain of the P-channel MOS transistor Q5 is connected to the drain of the input N-channel MOS transistor Q2.

The gate of the switching P-channel MOS transistor Q6 is connected to an input terminal $T_{IN3}$, and the gate of the switching P-channel MOS transistor Q7 is connected to an input terminal $T_{IN4}$. A signal B to which the logic operation is to be applied is supplied to the input terminal $T_{IN3}$, and an inverted signal XB of the signal B is supplied to the input terminal $T_{IN4}$.

The source of each of the input N-channel MOS transistors Q1 and Q2 is connected to a lower voltage line Vss through the N-channel MOS transistor Q3. The gate of the input N-channel MOS transistor Q1 is connected to an input terminal $T_{IN1}$, so that a switching control operation of the input N-channel MOS transistor Q1 is carried out in accordance with signals supplied to the input terminal $T_{IN1}$. The gate of the input N-channel MOS transistor Q2 is connected to an input terminal $T_{IN2}$, so that a switching operation of the input N-channel MOS transistor Q2 is carried out in accordance with signals supplied to the input terminal $T_{IN2}$.

A signal A to which the logic operation is applied is supplied to the input terminal $T_{IN1}$, and an inverted signal XA of the signal A is supplied to the input terminal $T_{IN2}$. A node at which the drain of the input N-channel MOS transistor Q1 and the drain of P-channel MOS transistor Q4 are connected to each other is one of the outputs of the differential amplifier 1, and the node is connected to an output terminal $T_{OUT}$ through an output P-channel MOS transistor Q8. In addition, a node at which the drain of the input N-channel MOS transistor Q2 and the drain of the P-channel MOS transistor Q5 are connected to each other is another output of the differential amplifier 1, and the node is connected to the output terminal $T_{OUT1}$ through an output P-channel MOS transistor Q9.

The gate of the output P-channel MOS transistor Q8 is connected to an input terminal $T_{IN5}$ to which the inverted signal XB of the signal B is supplied. The gate of the output P-channel MOS transistor Q9 is connected to an input terminal $T_{IN6}$ to which the signal B is supplied.

When the signal B has a low level ("0"), the P-channel MOS transistors Q6 and Q9 to which the signal B is supplied are in an on state. At this time, the P-channel MOS transistors Q7 and Q8 to which the inverted signal XB is supplied are in an off state. As a result, the current mirror circuit 2 is in a state where the gate of each of the P-channel MOS transistors Q4 and Q5 is electrically connected to the drain of the P-channel MOS transistor Q4 but is electrically disconnected from the drain of the P-channel MOS transistor Q5. In addition, the output terminal $T_{OUT1}$ is electrically connected to the drain of the input N-channel MOS transistor Q2 but is electrically disconnected from the drain of the input N-channel MOS transistor Q1. Thus, in this case, in the differential amplifier 1, the input terminal $T_{IN1}$ functions as a non-inverting terminal and the input terminal $T_{IN2}$ functions as an inverting terminal, so that the differential amplifier 1 functions as a non-inverting amplifier circuit with respect to the signal A input to the input terminal $T_{IN1}$.

On the other hand, when the signal has a high level ("1"), the P-channel MOS transistors Q6 and Q9 to which the signal B is supplied are in the off state. At this time, the P-channel MOS transistors Q7 and Q8 to which the inverted signal XB of the signal B is supplied to are in the on state. As a result, the current mirror circuit 2 is in a sate where the gate of each of the P-channel MOS transistors Q4 and Q5 is electrically connected to the drain of the P-channel MOS transistor Q5 but is electrically disconnected from the drain of the P-channel MOS transistor Q4. In addition, the output terminal $T_{OUT1}$ is electrically connected to the drain of the input N-channel MOS transistor Q1 through the P-channel transistor Q8 but is electrically disconnected to the drain of the input N-channel MOS transistor Q2. Thus, in this case, in the differential amplifier 1, the input terminal $T_{IN1}$ functions as the inverting terminal and the input terminal $T_{IN2}$ functions as the non-inverting, so that the differential amplifier 1 functions as an inverting amplifier circuit with respect to the signal A input to the input terminal $T_{IN1}$.

Figure 5:
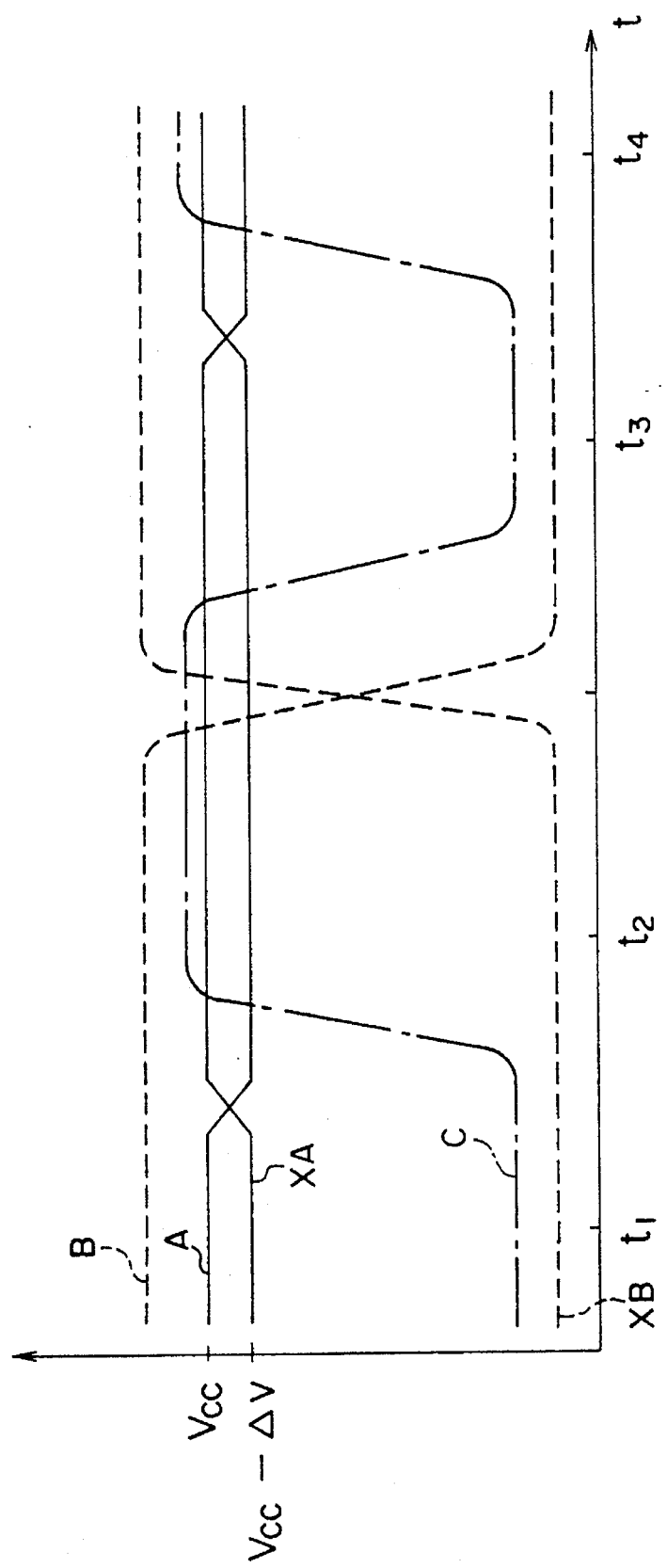
FIG. 5 is a wave form diagram illustrating signals to which a logic operation is applied in the logic circuit shown in FIG. 4.

Wave forms of the input signals A, XA, B and XB and an output signal C are shown in FIG. 5. In FIG. 5, continuous lines represent the signal A and the inverted signal XA thereof both of which are the infinitesimal signals, dotted lines represent the signal B and the inverted signal XB thereof both of which have a normal amplitude and a chain line represents the output signal C.

Referring to FIG. 5, at a time t1, the infinitesimal signal A has a high level Vcc ("1"), the inverted signal XA thereof has a low level (Vcc-ΔV), the signal B has the high level and the inverted signal XB thereof has the low level. At this time, the P-channel MOS transistors Q6 and Q9 are in the off state and the P-channel MOS transistors Q7 and Q8 are in the on state. That is, the differential amplifier 1 functions as the inverting amplifier circuit with respect to the infinitesimal signal A. Thus, since the infinitesimal signal A has the high level Vcc ("1"), the output signal C at the output terminal $T_{OUT1}$ has the low level ("0"). When the infinitesimal signal A becomes the low level (Vcc-ΔV) at a time t2, the differential amplifier 1 functions as the inverting amplifier circuit with respect to the infinitesimal signal A. As a result, the output signal C at the output terminal $T_{OUT1}$ becomes the high level ("1") .

At a time 3, the signal B has the low level and the inverted signal XB thereof has the high level ("1"). At this time, the P-channel MOS transistors Q6 and Q9 are in the on state and the P-channel MOS transistors Q7 and Q8 are in the off state, so that the differential amplifier 1 functions as the non-inverting amplifier circuit with respect to the infinitesimal signal A. Thus, the output signal C at the output terminal $T_{OUT1}$ has the low level ("0"). Further, when the infinitesimal signal A is inverted so as to have the high level Vcc ("1") at a time 4, the output signal C at the output terminal $T_{OUT1}$ becomes the high level ("1").

Figures 6, 7:
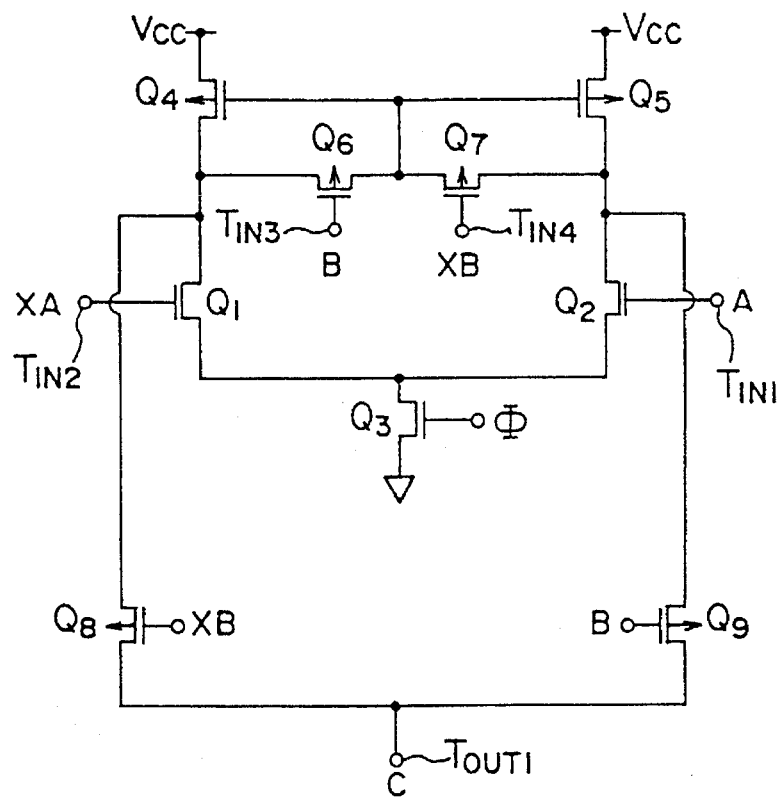
FIG. 6 is a table showing levels of the signals to which the logic operation is applied in the logic circuit shown in FIG. 4.
FIG. 7 is a circuit diagram illustrating a logic circuit according to a second embodiment of the present invention.

The operation represented by the signal wave forms shown in FIG. 5 is collectively indicated in FIG. 6.

Referring to FIG. 6, when the infinitesimal signal A has the low level and the signal B has the high level, the output signal C has the high level. When infinitesimal signal A has the high level and the signal B has the high level, the output signal C has the low level. When the infinitesimal signal A has the low level and the signal B has the low level, the output signal C has the low level. When the infinitesimal signal A has the high level and the signal B has the low level, the output signal C has the high level. That is, the logic circuit shown in FIG. 4 carries out a logic operation corresponding to an exclusive OR operation.

Figure 2:
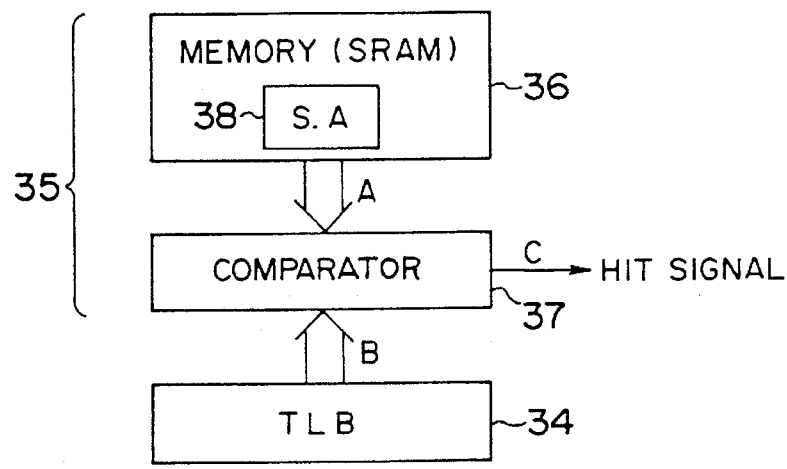
FIG. 2 is a block diagram illustrating an essential part of an MPU provided in the MPU system shown in FIG. 1.
Figure 3A:
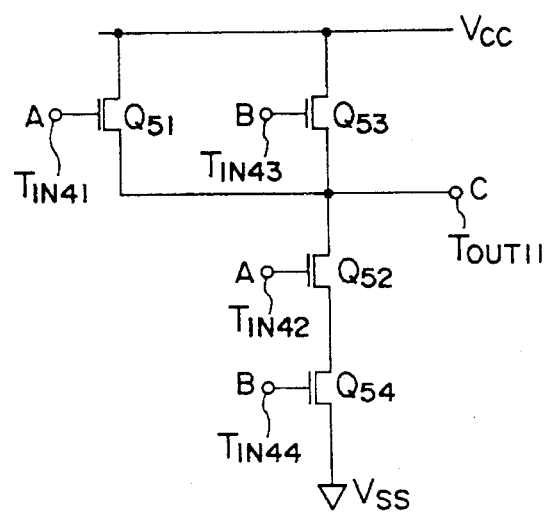
FIG. 3A is a circuit diagram illustrating a structure of an example of a conventional logic circuit.
Figure 3B:
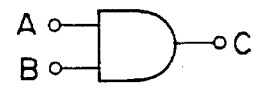
FIG. 3B is a diagram illustrating a symbol representing the logic circuit shown in FIG. 3A.

According to the logic circuit according to the first embodiment, the relationship between the input and output in the differential amplifier 1 having the current mirror circuit 2 is switched in accordance with the level of the signal B. As a result, the exclusive OR operation as shown in FIGS. 5 and 6 and the amplification of the infinitesimal signal are simultaneously performed. Thus, even if the infinitesimal signal A, such as the signal read out from the memory shown in FIG. 2, is directly supplied to the logic circuit shown in FIG. 4, the exclusive OR operation of the infinitesimal signal A and the signal B is normally carried out in the logic circuit. Thus, since an external amplifier for amplifying a signal to be supplied to the logic circuit is not needed, the logic operation of signals including the infinitesimal signal can be carried out at the high rate.

Figures 8, 9:
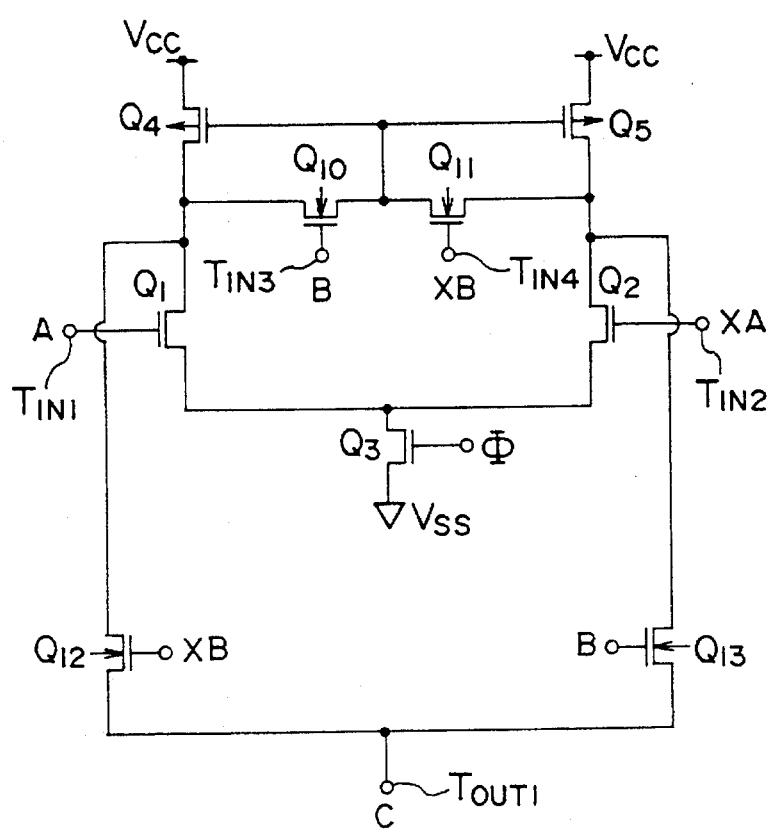
FIG. 8 is a table showing levels of signals to which the logic operation is applied in the logic circuit shown in FIG. 7.
FIG. 9 is a circuit diagram illustrating a logic circuit according to a third embodiment of the present invention.

A description will now given, with reference to FIGS. 7 and 8, of a second embodiment of the present invention. In FIG. 7 showing the structure of the logic circuit according to the second embodiment, those parts which are the same as those shown in FIG. 4 are given the same reference numbers, the description of those parts will be omitted.

In the second embodiment, the input terminals $T_{IN1}$ and $T_{IN2}$, shown in FIG. 4, are substituted for each other, so that the signal A and the inverted signal XA are respectively supplied to the input N-channel MOS transistors Q2 and Q1 in contrast with those in the first embodiment. Thus, when the signal B has the high level, the differential amplifier 1 functions as the non-inverting amplifier circuit with respect to the signal A. When the signal B has the low level, the differential amplifier 1 functions as the inverting amplifier circuit with respect to the signal A.

The relationships between the input signals A and B and the output signal C in the logic circuit shown in FIG. 7 is indicated in FIG. 8.

Referring to FIG. 8, when the signal A has the low level and the signal B has the high level, the output signal C has the low level. When both the signals A and B have the high level, the output signal C has the high level. When both the signals A and B have the low level, the output signal C has the high level. Further, when the signal A has the high level and the signal B has the low level, the output signal C has the low level. That is, in the logic circuit according to the second embodiment, the exclusive NOR operation of the signal A and B is carried out.

According to the second embodiment, the same advantages as in the first embodiment can be obtained.

A description will now be given, with reference to FIGS. 9 and 10, of a third embodiment of the present invention. In FIG. 9 showing the structure of the logic circuit according to the third embodiment, those parts which are the same as those shown in FIG. 4 are given the same reference numbers, and the description of those parts will be omitted.

In the third embodiment, N-channel MOS transistors Q10, Q11, Q12 and Q13 are substituted for the P-channel MOS transistors Q6, Q7, Q8 and Q9, shown in FIG. 4, used for the switching operation in accordance with the signals B and XB supplied thereto. The N-channel MOS transistors Q10, Q11, Q12 and Q13 are turned on and off by the signals B and XB in contrast with the P-channel MOS transistors Q6, Q7, Q8 and Q9 shown in FIG. 4.

Thus, in the differential amplifier 1, when the signal B has the high level, the N-channel MOS transistors Q10 and Q13 are in the on state and the N-channel MOS transistors Q11 and Q12 to which the inverted signal XB is supplied are in the off state. That is, when the signal B has the high level, the differential amplifier 1 functions as the non-inverting amplifier circuit with respect to the signal A. On the other hand, when the signal B has the low level, the N-channel MOS transistors Q10 and Q13 are in the off state and the N-channel MOS transistors Q11 and Q12 are in the on state. That is, when the signal B has the low level, the differential amplifier 1 functions as the inverting amplifier circuit with respect to the signal A.

Figures 10, 11:
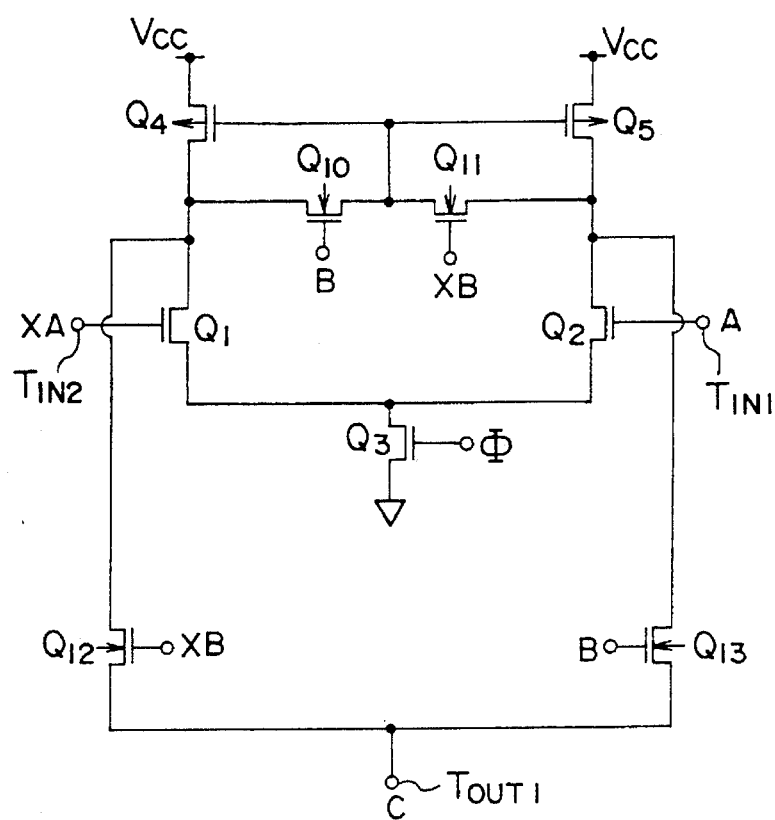
FIG. 10 is a table showing levels of signals to which the logic operation is applied in the logic circuit shown in FIG. 9.
FIG. 11 is a circuit diagram illustrating a logic circuit according to a fourth embodiment of the present invention.

In the logic circuit shown in FIG. 9, the relationship between the input signals A and B and the output signal C as shown in FIG. 10. This relationship is the same as that shown in FIG. 6. Thus, the logic circuit according to the third embodiment outputs the output signal C obtained by the exclusive NOR operation of the signals A and B.

According to the third embodiment, the same advantages as in the first embodiment can be obtained.

A description will now be given, with reference to FIGS. 11 and 12, of a fourth embodiment of the present invention. In FIG. 11 showing the structure of the logic circuit according to the fourth embodiment, those parts which are the same as those shown in FIG. 9 are given of the same reference numbers, and the description of those parts will be omitted.

In the fourth embodiment, the input terminal $T_{IN1}$ to which the signal A is supplied and the input terminal $T_{IN2}$ to which the signal B is supplied, shown in FIG. 9, are substituted for each other. Thus, in the differential amplifier 1, when the signal B has the high level, the N-channel MOS transistors Q10 and Q13 are in the on state and the N-channel MOS transistors Q11 and Q12 to which the inverted signal XB is supplied are the off state, so that the differential amplifier 1 functions as the inverting amplifier circuit with respect to the signal A. On the other hand, when the signal has the low level, the N-channel MOS transistors Q10 and Q13 are in the off state and the N-channel MOS transistors Q11 and Q12 to which the inverted signal XB is supplied are the on state, so that the differential amplifier 1 functions as the non-inverting amplifier circuit with respect to the signal A.

Figures 12, 13:
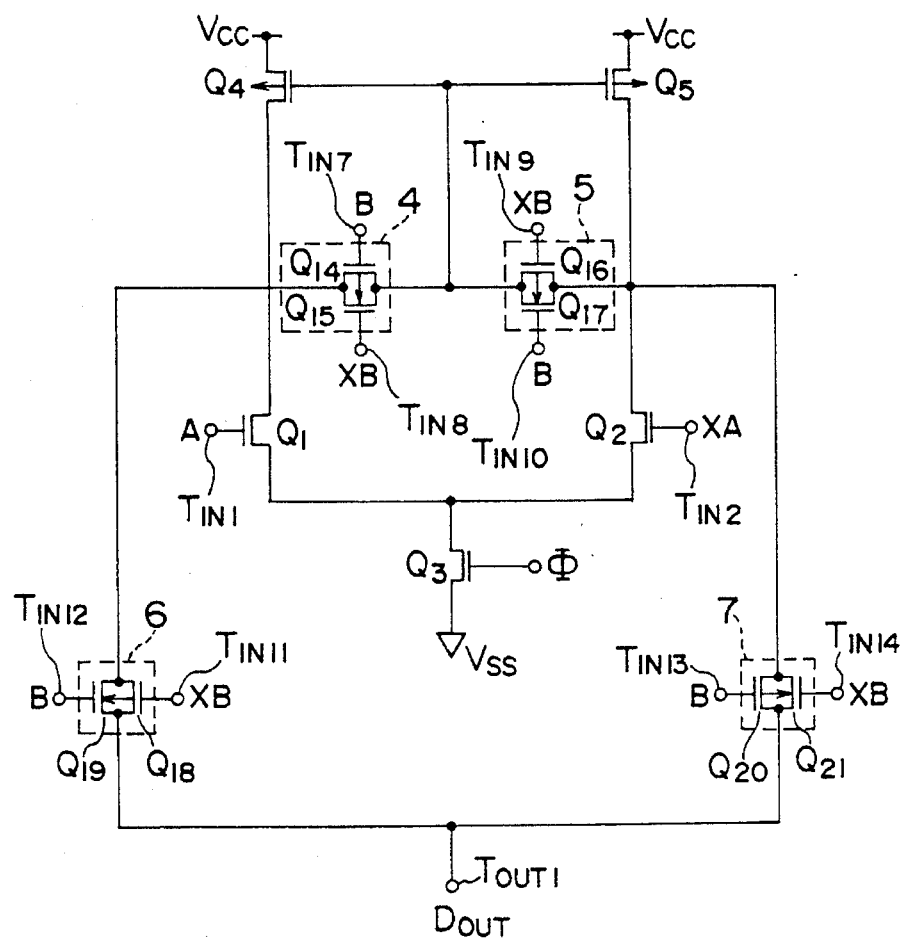
FIG. 12 is a table showing levels of signals to which the logic operation is applied in the logic circuit shown in FIG. 11.
FIG. 13 is a circuit diagram illustrating a logic circuit according to a fifth embodiment of the present invention.

The relationship between the input signals A and B and the output signal C is shown in FIG. 12. This relationship is the same as that shown in FIG. 6. That is, the logic circuit according to the fourth embodiment outputs the output signal C obtained by the exclusive OR operation of the signals A and B.

According to the fourth embodiment, the same advantages as in the first embodiment can be obtained.

A description will now be given, with reference to FIGS. 13 and 14, of a fifth embodiment of the present invention. In FIG. 13 showing the structure of the logic circuit according to the fifth embodiment, those parts which are the same as those shown in FIG. 4 are given the same reference numbers, and the description of those parts will be omitted.

In the fifth embodiment, transfer gates 4, 5 6 and 7 are substituted for the P-channel MOS transistors Q6, Q7, Q8 and Q9 used for the switching operation in the first embodiment. Referring to FIG. 13, the transfer gate 4 is formed of a P-channel MOS transistor Q14 and an N-channel MOS transistor Q15. The source and the drain of the P-channel MOS transistor Q14 are respectively connected to the source and the drain of the N-channel MOS transistor Q15. The gate of the P-channel MOS transistor Q14 is connected to an input terminal $T_{IN7}$, and the gate of the N-channel MOS transistor Q15 is connected to an input terminal $T_{IN8}$. The input terminal $T_{IN7}$ is provided with the signal B, and the input terminal $T_{IN8}$ is provided with the inverted signal XB of the signal B.

The transfer gate 5 is formed of a P-channel MOS transistor Q16 and an N-channel MOS transistor Q17. The source and the drain of the P-channel MOS transistor Q16 are respectively connected to the source and the drain of the N-channel MOS transistor Q17. The gate of the P-channel MOS transistor Q16 is connected to an input terminal $T_{IN9}$, and the gate of the N-channel MOS transistor Q17 is connected to an input terminal $T_{IN10}$. The signal B is supplied to the input terminal $T_{IN9}$, and the inverted signal XB of the signal B is supplied to the input terminal $T_{IN10}$.

The transfer gate 6 is formed of a P-channel MOS transistor Q18 and an N-channel MOS transistor Q19. The source and the drain of the P-channel MOS transistor Q18 are respectively connected to the source and the drain of the N-channel MOS transistor Q19. The gate of the P-channel MOS transistor Q18 is connected to an input terminal $T_{IN11}$, and the gate of the N-channel MOS transistor Q19 is connected to an input terminal $T_{IN12}$. The signal B and the inverted signal XB thereof are respectively supplied to the input terminals $T_{IN11}$ and $T_{IN12}$.

The transfer gate 7 is formed of a P-channel MOS transistor Q20 and an N-channel MOS transistor Q21. The source and the drain of the P-channel MOS transistor Q20 are respectively connected to the source and the drain of the N-channel MOS transistor Q21. The gate of the P-channel MOS transistor Q20 is connected to an input terminal $T_{IN13}$, and the gate of the N-channel MOS transistor Q21 is connected to an input terminal $T_{IN14}$. The signal B and the inverted signal XB thereof are respectively supplied to the input terminals $T_{IN13}$ and $T_{IN14}$.

When the signal B and the inverted signal XB respectively have the high level and the low level, the transfer gates 5 and 6 are in the on state and the transfer gates 4 and 7 are in the off state. On the other hand, when the signal B and the inverted signal XB respectively have the low level and the high level, the transfer gates 5 and 6 are in the off state and the transfer gates 4 and 7 are in the on state. That is, the transfer gates 5 and 6 operate in the same manner as the P-channel MOS transistors Q7 and Q8 in the first embodiment, and the transfer gates 4 and 7 operate in the same manner as the P-channel MOS transistors Q6 and Q9 in the first embodiment.

Figures 14, 15:
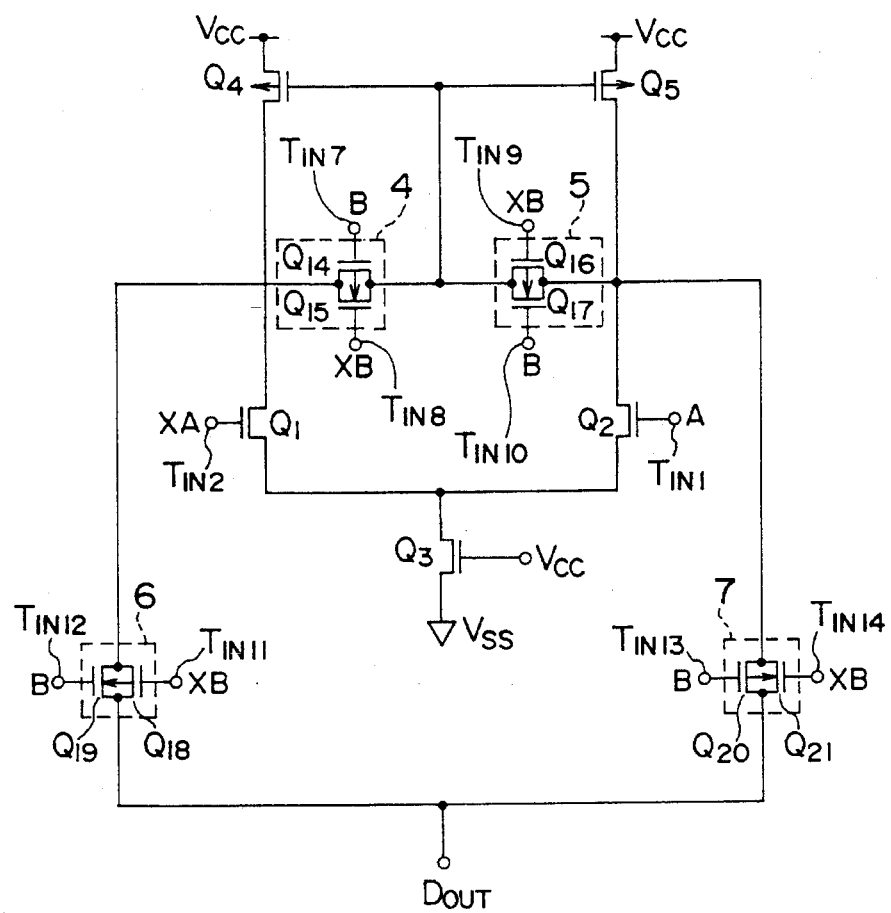
FIG. 14 is a table showing levels of signals to which the logic operation is applied in the logic circuit shown in FIG. 13.
FIG. 15 is a circuit diagram illustrating a logic circuit according to a sixth embodiment of the present invention.

Thus, the logic circuit according to the fifth embodiment operates in the same manner as that in the first embodiment so as to output the output signal C obtained by the exclusive OR operation of the signals A and B, as shown in FIG. 14.

According to the fifth embodiment, the same advantages as in the first embodiment can be obtained.

Figures 16, 17:
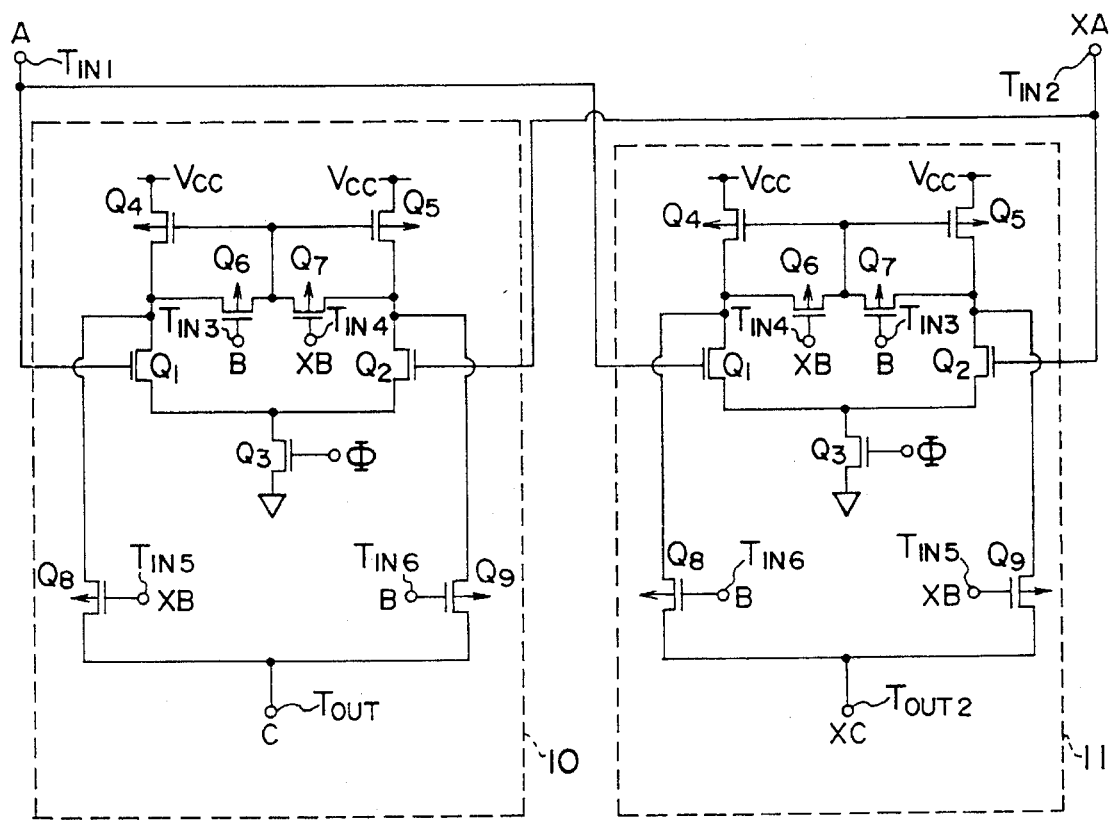
FIG. 16 is a table showing levels of signals to which the logic operation is applied in the logic circuit shown in FIG. 15.
FIG. 17 is a circuit diagram illustrating a logic circuit according to a seventh embodiment of the present invention.

A description will now be given, with reference to FIGS. 15 and 16, of a sixth embodiment of the present invention. In FIG. 15 showing the structure of the logic circuit according to the sixth embodiment, those parts which are the same as those shown in FIG. 13 are given the same reference numbers, and the description of those parts will be omitted.

In the sixth embodiment, the input terminals $T_{IN1}$ and $T_{IN2}$ to which the signal A and the inverted signal XA thereof are respectively supplied in the fifth embedment are substituted for each other. As a result, the logic circuit in the sixth embodiment carries out the exclusive NOR operation, as shown in FIG. 16, and the same advantages as in the fifth embodiment can be obtained.

A description will now be given, with reference to FIGS. 17 and 18, of a seventh embodiment of the present invention. In FIG. 17 showing the structure of the logic circuit according to the seventh embodiment, those parts which are the same as those shown in FIG. 4 are given the same reference numbers, and the description of those parts will be omitted.

In the seventh embodiment, the output signal C and an inverted signal XC of the signal C are obtained. Referring to FIG. 17, the logic circuit according to the seventh embodiment is formed of a first logic circuit 10 and a second logic circuit 11. The first logic circuit 10 has the same structure as that according to the first embodiment shown in FIG. 4. In the second logic circuit 11, the input terminals $T_{IN3}$ and $T_{IN4}$ in the first embodiment are substituted for each other, and the input terminals $T_{IN5}$ and $T_{IN6}$ in the firs embodiment are substituted for each other. In the second logic circuit 11, the relationships between the input terminals and the signals B and XB are contrary to the relationships between them in the logic circuit according to the first embodiment. Thus, if the first logic circuit 10 (which is the same as that in the first embodiment) functions as the inverting amplifier circuit with respect to the signal A, the second logic circuit 11 functions as the non-inverting amplifier circuit with respect to the signal A. In addition, if the first logic circuit 10 functions as the non-inverting amplifier circuit with respect to the signal A, the second logic circuit 11 functions as the inverting amplifier circuit with respect to the signal A. As a result, when the first logic circuit 10 obtains the output signal C at the output terminal $T_{OUT1}$, the second logic circuit 11 obtains the inverted output signal XC of the output signal C at the output terminal $T_{OUT1}$.

Figures 18, 19:
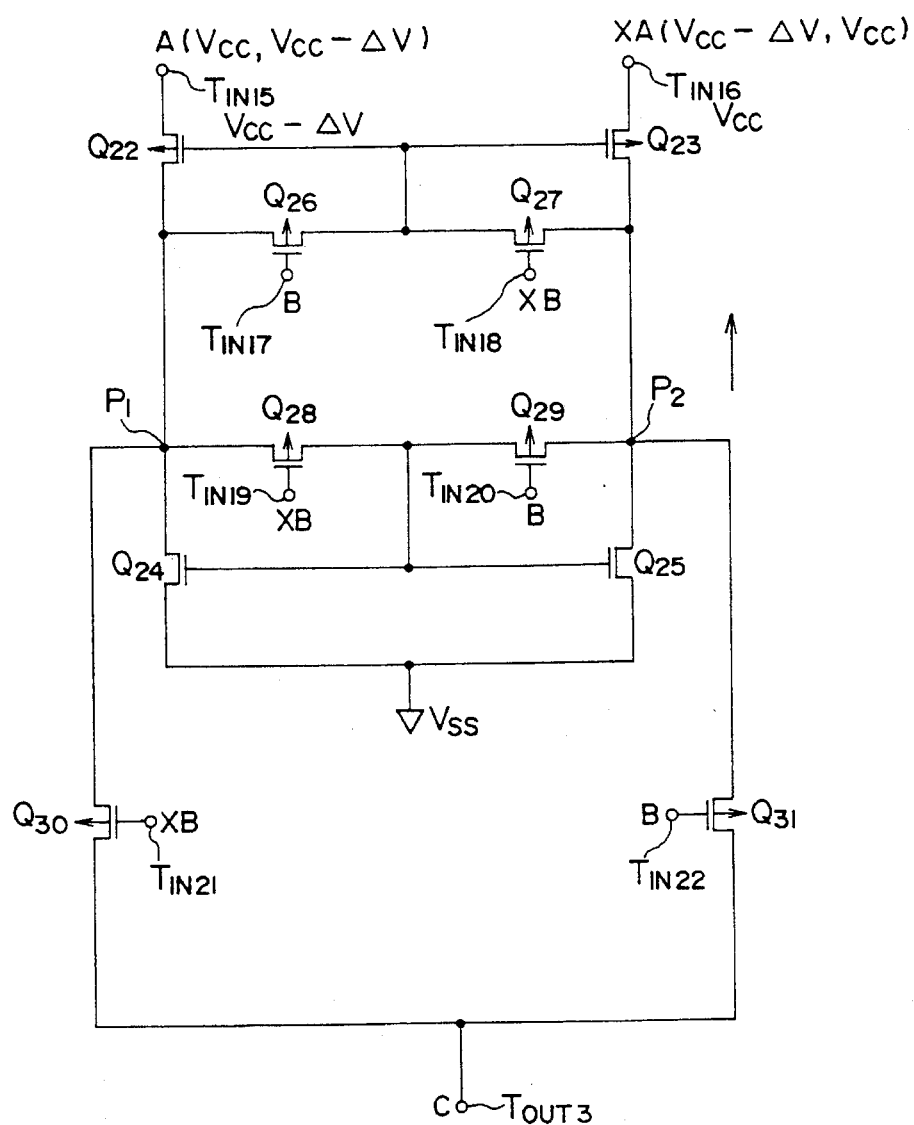
FIG. 18 is a table showing levels of signals to which the logic operation is applied in the logic circuit shown in FIG. 17.
FIG. 19 is a circuit diagram illustrating a logic circuit according to a eighth embodiment of the present invention.

The logic circuit .according to the seventh embodiment outputs the output signal C and the inverted output signal XC obtained by the exclusive OR operation of the signals A and B as shown in FIG. 18.

A description will now be given, with reference to FIGS. 19 and 20, of a eighth embodiment of the present invention. The logic circuit according to the eighth embodiment is formed by use of a current sense amplifier.

Referring to FIG. 19, a fundamental circuit of the current sense amplifier is formed of P-channel MOS transistors Q22 and Q23 and N-channel MOS transistors Q24 and Q25, in which amplifier complementary signals corresponding to an infinitesimal current difference is supplied thereto and the infinitesimal current difference is converted into a voltage corresponding thereto. The gates of the P-channel MOS transistors Q22 and Q23 are connected to each other. The gates are connected to the drain of the P-channel MOS transistor Q22 through a P-channel MOS transistor Q26 for the switching operation. The gates of the P-channel MOS transistors Q22 and Q23 are also connected to the drain of the P-channel MOS transistor Q23 through a P-channel MOS transistor Q27 for the switching operation.

The source of the P-channel MOS transistor Q22 is connected to an input terminal $T_{IN15}$ to which the signal A is supplied, and the source of the P-channel MOS transistor Q23 is connected to an input terminal $T_{IN16}$ to which the inverted signal XA is supplied. The gate of the P-channel MOS transistor Q26 is connected to an input terminal $T_{IN17}$ to which the signal B is supplied, and the gate of the P-channel MOS transistor Q27 is connected to an input terminal $T_{IN18}$ to which the inverted signal XB is supplied. The P-channel MOS transistors Q26 and Q27 carry out a switching operation in accordance with the signals B and XB so that the gates of the P-channel MOS transistors Q22 and Q23 are electrically connected either to the drain of the P-channel MOS transistor Q22 or to the drain of the P-channel MOS transistor Q23.

The gates of the N-channel MOS transistors Q24 and Q25 are connected to each other. The gates are connected to the drain of the N-channel MOS transistor Q24 through a P-channel MOS transistor Q28 for the switching operation. The gates of the N-channel MOS transistors Q24 and Q25 are also connected to the drain of the N-channel MOs transistor Q25 through a P-channel MOS transistor Q29 for the switching operation. The source of each of the N-channel MOS transistors Q24 and Q25 is connected to a lower power line Vss (having the ground level).

The gate of the P-channel MOS transistor Q28 is connected to an input terminal $T_{IN19}$ to which the inverted signal XB of the signal B is supplied. The gate of the P-channel MOS transistor Q29 is connected to an input terminal $T_{IN20}$ to which the signal B is supplied. The P-channel transistors Q28 and Q29 carry out a switching operation in accordance with the signal B and the inverted signal XB so that the gates of the N-channel MOS transistors Q24 and Q25 are electrically connected either to the drain of the N-channel MOS transistor Q24 or to the drain of the N-channel MOS transistor Q25.

The drain of the P-channel MOS transistor Q22 and the drain of the N-channel MOS transistor Q24 are connected to each other. The connecting point of the P-channel MOS transistor Q22 and the N-channel MOS transistor Q24 is connected to an output terminal $T_{OUT3}$ through a P-channel MOS transistor Q30. In addition, the drain of the P-channel MOS transistor Q23 and the drain of the N-channel MOS transistor Q24 are connected to each other. The connecting point of the P-channel MOS transistor Q23 and the N-channel MOS transistor Q25 is connected to the output terminal $T_{OUT3}$ through a P-channel MOS transistor Q31.

The gate of the P-channel MOS transistor Q30 is connected to an input terminal $T_{IN21}$ to which the inverted signal XB of the signal B is supplied, and the gate of the P-channel MOS transistor Q31 is connected to an input terminal $T_{IN22}$ to which the signal B is supplied. The P-channel MOS transistors Q30 and Q31 carry out a switching operation in accordance with the signals B and XB so that the output terminal $T_{OUT3}$ is electrically connected either to a point P1 at which the transistors Q22, Q24, Q26 and Q28 are connected to each other or to a point P2 at which the transistors Q23, Q25, Q27 and Q29 are connected to each other.

Figures 20, 21:
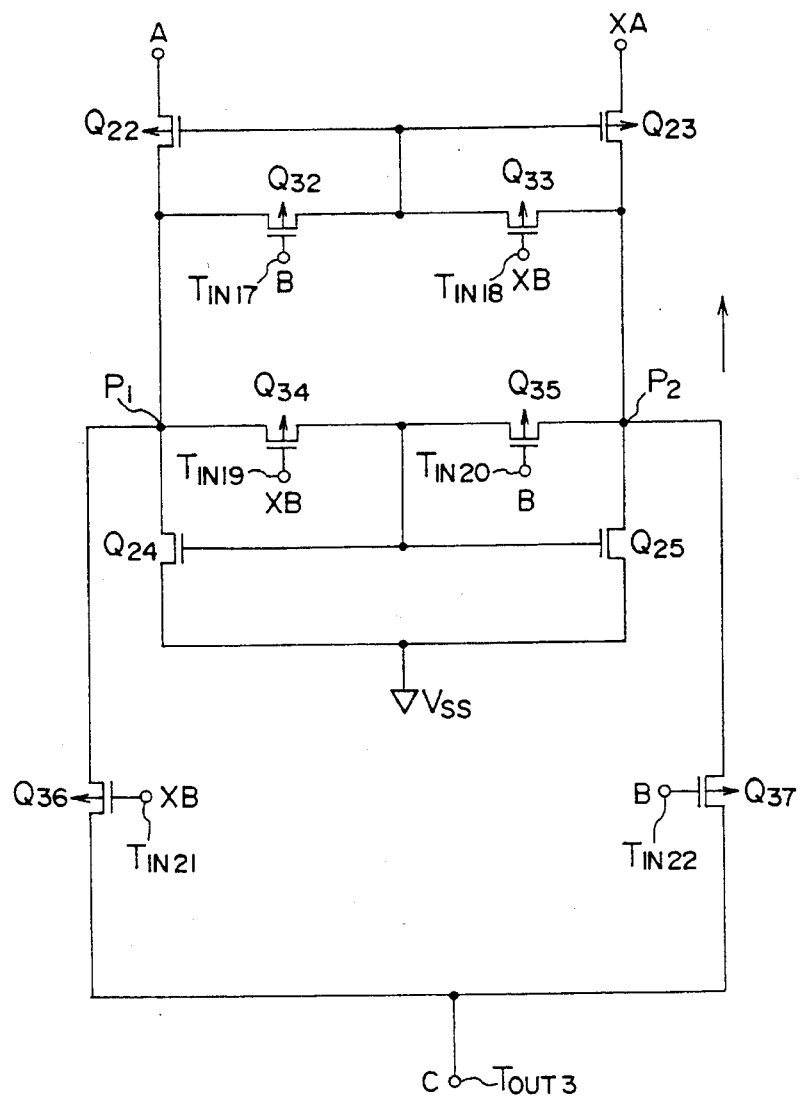
FIG. 20 is a table showing levels of signals to which the logic operation is applied in the logic circuit shown in FIG. 19.
FIG. 21 is a circuit diagram illustrating a logic circuit according to a ninth embodiment of the present invention.

FIG. 20 shows states of the input signals and the output signal in the logic circuit according to the eighth embodiment. Referring to FIG. 20, when the signal B has the high level, the P-channel MOS transistors Q26, Q29 and Q31 to which the signal B is supplied are the off state. At this time, since the inverted signal XB has the low level, the P-channel MOS transistors Q27, Q28 and the Q30 to which the inverted signal XB are the on state. Thus, the gates of the P-channel MOS transistors Q22 and Q23 are electrically connected to the point P2, and the gates of the N-channel MOS transistors Q24 and Q25 are electrically connected to the point P1. Further, the output terminal $T_{OUT3}$ is electrically connected to the point P1.

In this state, when the signal A becomes the high level (Vcc) and the inverted signal XA thereof becomes the low level (Vcc-ΔV), the P-channel MOS transistors Q22 and Q23 are turned on and the N-channel MOS transistors Q24 and Q25 are turned off. Thus, the point P1 has the high level and the point P2 has the low level, so that the output signal C has the high level.

On the other hand, when the signal A becomes the low level (Vcc-ΔV) and the inverted signal XA thereof becomes the high level in the above state, the P-channel MOS transistors Q22 and Q23 are turned off and the N-channel MOS transistors Q24 and Q25 are turned on. Thus, the output terminal $T_{OUT3}$ is electrically connected to the lower power line (Vss), so that the output signal C has the low level.

As a result, the output signal C is changed in accordance with the input signals A and B as shown in FIG. 20. That is, the logic circuit shown in FIG. 19 (according to the eighth embodiment) outputs the output signal C obtained by the exclusive OR operation of the signals A and B.

Next, when the signal B has the low level, the P-channel MOS transistors Q26, Q29 and Q31 to which the signal B is supplied are in the on state and the P-channel MOS transistors Q27, Q28 and Q30 to which the inverted signal XB is supplied are in the off state. Thus, the gates of the P-channel MOS transistors Q22 and Q23 are electrically connected to the point P1, and the gates of the N-channel MOS transistors Q24 and Q25 are electrically connected to the point P2. Further, the output terminal $T_{OUT3}$ is electrically connected to the point P2.

In this state, the signal A and the inverted signal XA thereof respectively become the low level (Vcc-ΔV) and the high level (Vcc), the P-channel MOS transistors Q22 and Q23 are turned off and the N-channel MOS transistors Q24 and Q25 are turned on. Thus, the output terminal $T_{OUT3}$ is electrically connected to the lower power line (Vss), so that the output signal C has the low level.

On the other hand., when the signal A and the inverted signal XA thereof respectively become the high level (Vcc) and the low level (Vcc-ΔV) in the above state, the P-channel MOS transistors Q22 and Q23 are turned on and the N-channel MOS transistors Q24 and Q25 are turned off. Thus, the output signal C has the high level.

As the result of the above operation, the output signal C is changed in accordance with the input signals A and B as shown in FIG. 20. That is, the logic circuit shown in FIG. 19 (according to the eighth embodiment) outputs the output signal C obtained by the exclusive OR operation of the signals A and B. In addition, the high level of the output signal C is equal to the voltage Vcc and the low level thereof is equal to the lower voltage Vss (the ground level). That is, even if the signal A is an infinitesimal signal, the output signal C has the enough amplitude. Thus, in the eighth embodiment, the same advantages as in the first embodiment are obtained.

A description will now be given, with reference to FIGS. 21 and 22, of a ninth embodiment of the present invention. In FIG. 21 showing the structure of the logic circuit according to the ninth embodiment, those parts which are the same as those shown in FIG. 19 are given the same reference numbers, and the description of those parts will be omitted.

In the ninth embodiment shown in FIG. 21, N-channel MOS transistors Q32, Q33, Q34, Q35, Q36 and Q37 are substituted for the P-channel MOS transistors Q26, Q27, Q28, Q29, Q30 and Q31 in the logic circuit according to the eighth embodiment.

According to the ninth embodiment, the relationships between the level of the signals B and XB and the connections of the transistors Q22, Q23, Q24 and Q25 to the points P1 and P2 stand in the contrast to those in the eighth embodiment. Thus, the logic circuit according to the ninth embodiment outputs the output signal C obtained by the exclusive NOR operation of the signals A and B, as shown in FIG. 22.

A description will now be given, with reference to FIGS. 23 and 24, of a tenth embodiment of the present invention. In FIG. 23 showing the structure of the logic circuit according to the tenth embodiment, those parts which are the same as those shown in FIG. 19 are given the same reference numbers, and the description of those parts will be omitted.

Figures 22, 23:
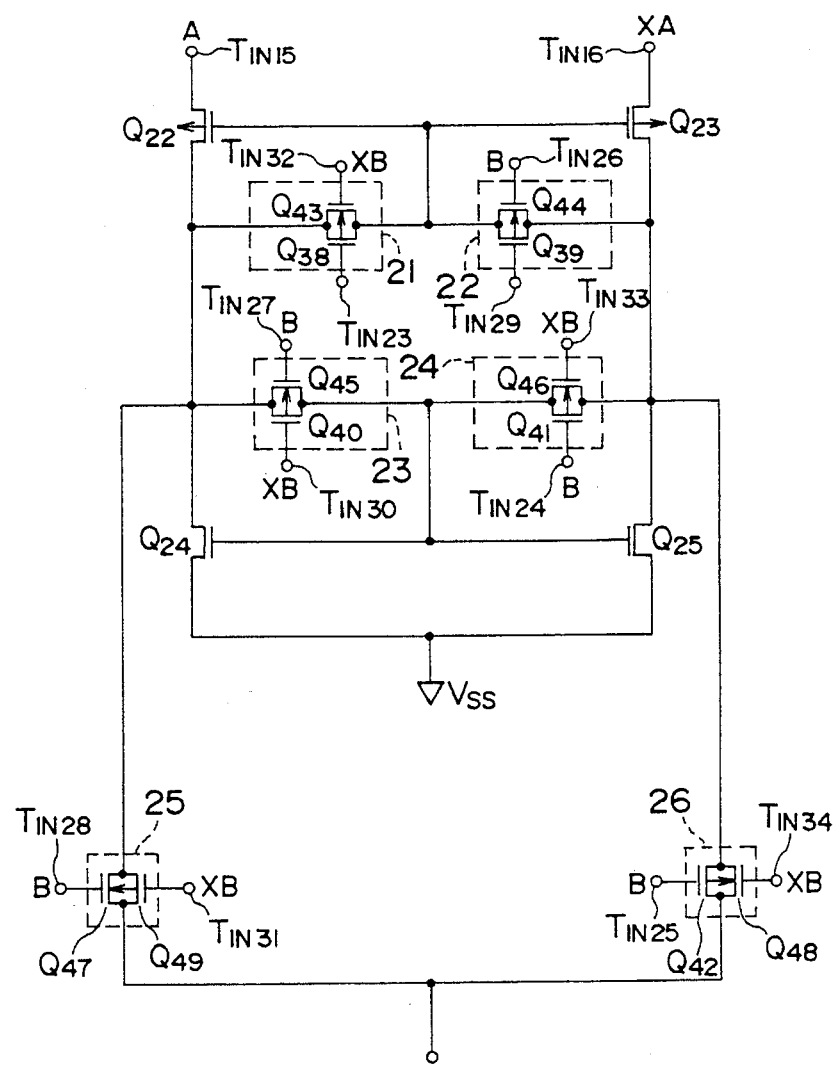
FIG. 22 is a table showing levels of signals to which the logic operation is applied in the logic circuit shown in FIG. 21.
FIG. 23 is a circuit diagram illustrating a logic circuit according to a tenth embodiment of the present invention.

In the tenth embodiment shown in FIG. 23, CMOS transfer gate 21, 22, 23, 24, 25 and 26 are substituted for the P-channel MOS transistors Q26, Q27, Q28, Q29, Q30 and Q31. Referring to FIG. 23, the respective COMS transfer gates 21–26 are formed of sets of P-channel MOS transistors and N-channel MOS transistors (38 and 43), (39 and 44), (40 and 45), (41 and 46), (41 and 47) and (42 and 48). In each of the sets, the source and the drain of the P-channel MOS transistor are respectively connected to the source and the drain of the N-channel MOS transistors. The gates of the P-channel MOS transistors Q38, Q41 and Q42 and the gates of the N-channel MOs transistors Q44, Q45 and Q47 are connected to input terminals $T_{IN23}$, $T_{IN24}$, $T_{IN25}$, $T_{IN26}$, $T_{IN27}$ and $T_{IN28}$ to which the signal B is supplied. The gates of the P-channel MOS transistors Q39, Q40 and Q49 and the N-channel MOS transistors Q43, Q46 and Q48 are connected to input terminals $T_{IN29}$, $T_{IN30}$, $T_{IN31}$, $T_{IN32}$, $T_{IN33}$ and $T_{IN34}$ to which the inverted signal XB of the signal B is supplied.

When the signal B and the inverted signal XB thereof respectively have the high level and the low level, each of the CMOS transfer gates 21–26 are in the off state. When the signal B and the inverted signal XB thereof respectively have the low level and the high level, each of the CMOS transfer gates 21–26 are in the on state. That is, the CMOS transfer gates 21–26 operate in the same manner as the P-channel MOS transistors Q26–Q31 in the eighth embodiment shown in FIG. 19. Thus, the logic circuit in the tenth embodiment shown in FIG. 23 carries out the exclusive OR operation, as shown in FIG. 24.

Figure 1:
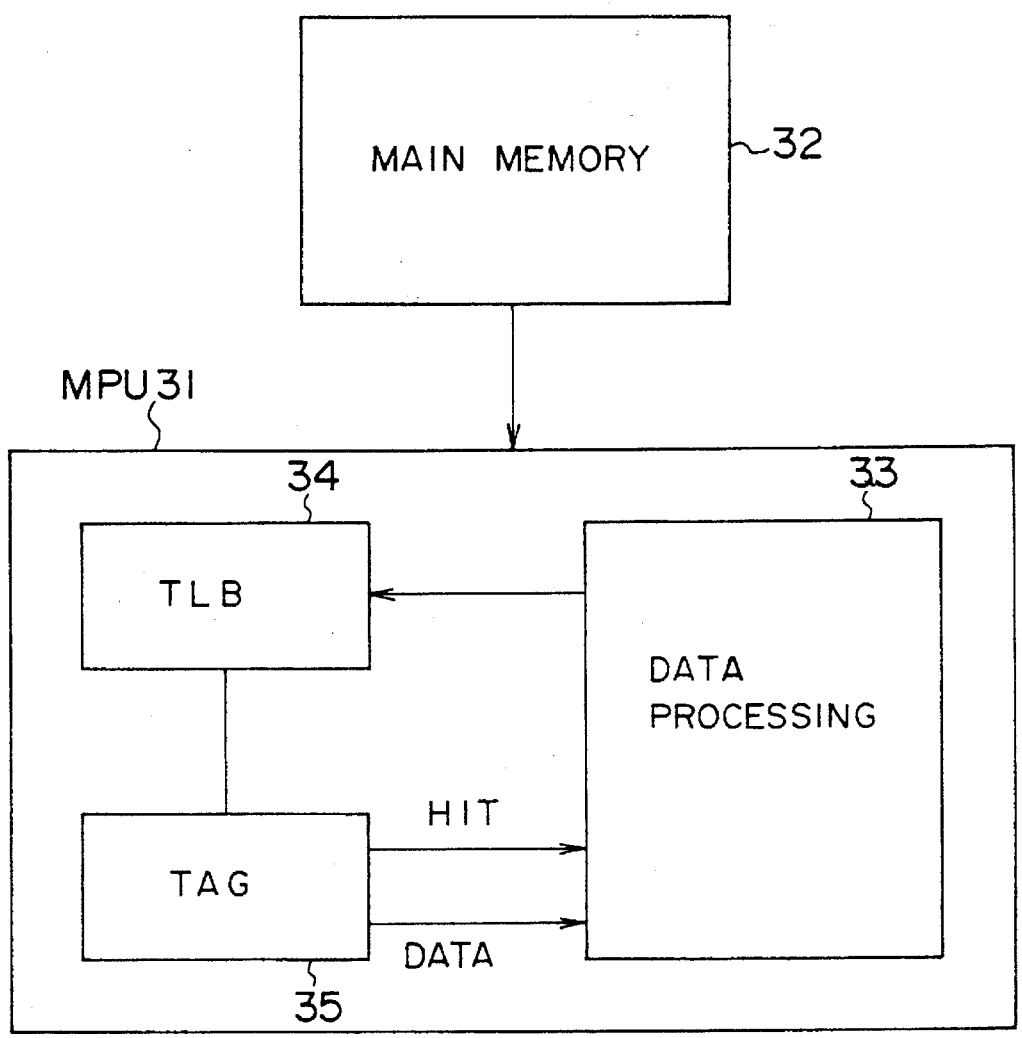
FIG. 1 is a block diagram illustrating an MPU system to which a logic circuit is applied.

The logic circuit according to each of the above embodiments may be applied to the comparing portion 37 of the TAG portion 35 in the MPU system as shown in FIGS. 1 and 2. In this case, a bit line BL and an inverting bit line *BL which are counterpart of each other in the memory 36 (e.g. S-RAM) are directly connected to the input terminals of the logic circuit. An inverted signal of a signal in the bit line BL passes through the inverting bit line *BL. The signal on the bit line BL and the inverted signal on the inverting bit line *BL are input as the signal A and the inverted signal XA to the input terminal. Thus, the delay caused by the sense amplifier 38 in conventional logic circuit can be eliminated, the MPU system can operate at a higher rate.

The present invention is not limited to the aforementioned embodiments, and variations and modifications may be made without departing from the scope of the claimed invention.

What is claimed is:
1. A logic circuit comprising:
a differential amplifier circuit to which a first input signal and a second input signal both of which are complementary are to be supplied, having a circuit for outputting a first output signal and a second output signal both of which are complementary, the first and second output signals depending on a difference between the first and second input signals;

an output terminal; and switching means for, based on a first switching signal and a second switching signal which are complementary, performing a switching operation so that either the first output signal or the second output signal is selected as a signal supplied to said output terminal, wherein the signal supplied to the output terminal is a result of an logical operation of the first input signal and the first switching signal.

2. The logic circuit as claimed in claim 1, wherein said circuit for outputting the first output signal and the second output signal has a first portion used to generate the first output signal and a second portion used to generate the second output signal.

3. The logic circuit as claimed in claim 2, wherein said switching means has first means for selecting either the first portion or the second portion of said circuit in accordance with levels of the first and second switching signals, and second means, operating with said first means, for supplying either the first output signal or the second output signal to said output terminal in accordance with the levels of the first and the second switching signals.

4. The logic circuit as claimed in claim 1, wherein said circuit for outputting the first and second output signals has a current mirror circuit.

5. The logic circuit as claimed in claim 3, wherein, when the first portion of said circuit for outputting the first and second outputting signals is selected by said switching means, said differential amplifier functions as an inverting amplifier with respect to the first and second input signals.

6. The logic circuit as claimed in claim 3, wherein, when the second portion of said circuit for outputting the first and second outputting signals is selected by said switching means, said differential amplifier functions as a non-inverting amplifier with respect to the first and second input signals.

7. The logic circuit as claimed in claim 3, wherein, when the first switching signal has a first level and the second switching signal has a second level lower than the first level, said first means of said switching means selects the first portion of said circuit for outputting the first and second signals, when the first switching signal has the second level and the second switching signal has the first level, said first means of said switching means selects the second portion of said circuit for outputting the first and second signals, so that the signal obtained by an exclusive OR operation of the first input signal and the first switching signal is output from the output terminal.

8. The logic circuit as claimed in claim 3, wherein, when the first switching signal has a first level and the second switching signal has a second level lower than the first level, said first means of said switching means selects the second portion of said circuit for outputting the first and second signals, when the first switching signal has the second level and the second switching signal has the first level, said first means of said switching means selects the first portion of said circuit for outputting the first and second signals, so that the signal obtained by an exclusive NOR operation of the first input signal and the first switching signal is output from the output terminal.

9. A logic circuit comprising:

a current sense amplifier to which a first input signal and a second input signal both of which are complementary are to be supplied, having a circuit for outputting a first output signal and a second output signal both of which are complementary, said current sense amplifier sensing infinitesimal currents corresponding to said first and second input signals and converting the infinitesimal currents into a voltage depending on to a difference between the first and second input signals;

an output terminal; and switching means for, based on a first switching signal and a second switching signal which are complementary, performing a switching operation so that either the first output signal or the second output signal is selected as a signal supplied to said output terminal, wherein the signal supplied to the output terminal is a result of a logical operation of the first input signal and the first switching signal.

10. The logic circuit as claimed in claim 9, wherein said circuit for outputting the first output signal and the second output signal has a first portion used to generate the first output signal and a second portion used to generate the second output signal.

11. The logic circuit as claimed in claim 10, wherein said switching means has first means for selecting either the first portion or the second portion of said circuit in accordance with levels of the first and second switching signals, and second means, operating with said first means, for supplying either the first output signal or the second output signal to said output terminal in accordance with the levels of the first and the second switching signals.

12. The logic circuit as claimed in claim 11, wherein, when the first portion of said circuit for outputting the first and second output signals is selected by said switching means, said current sense amplifier functions as an inverting amplifier with respect to the first and second input signals.

13. The logic circuit as claimed in claim 11, wherein, when the second portion of said circuit for outputting the first and second output signals is selected by said switching means, said current sense amplifier functions as a non-inverting amplifier with respect to the first and second input signals.

14. The logic circuit as claimed in claim 11, wherein, when the first switching signal has a first level and the second switching signal has a second level lower than the first level, said first means of said switching means selects the first portion of said circuit for outputting the first and second signals, when the first switching signal has the second level and the second switching signal has the first level, said first means of said switching means selects the second portion of said circuit for outputting the first and second signals, so that the signal obtained by an exclusive OR operation of the first input signal and the first switching signal is output from the output terminal.

15. The logic circuit as claimed in claim 13, wherein, when the first switching signal has a first level and the second switching signal has a second level lower than the first level, said first means of said switching means selects the second portion of said circuit for outputting the first and second signals, when the first switching signal has the second level and the second switching signal has the first level, said first means of said switching means selects the first portion of said circuit for outputting the first and second signals, so that the signal obtained by an exclusive NOR operation of the first input signal and the first switching signal is output from the output terminal.

* * * * *